United States Patent [19]

Whikehart

[11] Patent Number: 5,227,794
[45] Date of Patent: Jul. 13, 1993

[54] FREQUENCY MULTIPLEXED ANALOG-DIGITAL CONVERSION

[75] Inventor: J. William Whikehart, Novi

[73] Assignee: Ford Motor Company, Dearborn, Mich.

[21] Appl. No.: 812,556

[22] Filed: Dec. 23, 1991

[51] Int. Cl.$^5$ .............................................. H03M 1/00
[52] U.S. Cl. .................................. 341/141; 341/144; 341/155
[58] Field of Search ............... 341/110, 141, 144, 155, 341/118

[56] References Cited

U.S. PATENT DOCUMENTS

| | | | |
|---|---|---|---|
| 3,999,129 | 12/1976 | Kasson | 341/110 |
| 4,097,860 | 6/1978 | Araseki et al. | 341/118 |
| 4,647,968 | 3/1987 | Willis | 341/155 X |
| 4,703,340 | 10/1987 | Balaban et al. | 358/19 |
| 5,124,707 | 6/1992 | Stove | 341/157 |
| 5,146,223 | 9/1992 | Muto | 341/118 |

FOREIGN PATENT DOCUMENTS 56-62424 5/1981 Japan.

Primary Examiner—Howard L. Williams
Attorney, Agent, or Firm—Mark Mollon; Roger L. May

[57] ABSTRACT

A single analog-digital converter (either analog-to-digital or digital-to-analog) is employed to simultaneously digitize both an AC information signal and a low frequency or DC control signal. The separate signals are added prior to conversion and are separated according to their frequency after conversion. Thus, a DC control signal can be digitized without the need for a second converter and without substantially reducing the dynamic range available for converting the main information signal.

6 Claims, 1 Drawing Sheet

FREQUENCY MULTIPLEXED ANALOG-DIGITAL CONVERSION

BACKGROUND OF THE INVENTION

The present invention relates in general to converting signals between the analog and the digital domains and, more specifically, to an analog-to-digital converter or a digital-to-analog converter wherein two separate signals are added together prior to conversion and are separated from each other after conversion so as to convert both signals using only a single converter.

Digital signal processing (DSP) is being adopted in many electronics applications, such as digital audio, signal measurement and analysis, and communications, for example. DSP uses specialized microprocessors which are adapted to perform signal processing functions digitally and at a high rate of speed. DSP achieves advantages in programming flexibility, inherent stability, increased accuracy, high reliability, and lower cost.

Most frequently, systems employing DSP have analog input signals and/or output signals. This requires conversion between the analog and digital domains, such as with an analog-to-digital (A/D) converter and a digital-to-analog (D/A) converter, both of which are referred to generically herein as analog-digital converters. In the context of the digital audio example, radio receivers are known which obtain an analog radio signal from an antenna, generate an analog intermediate frequency (IF) signal in a tuner, digitize the IF signal, demodulate and further process the resulting audio signal in DSP, convert the audio signal back to an analog signal, and reproduce analog audio signals using an amplifier and speakers. Besides the analog IF signal, the DSP processing typically will employ other analog inputs, such as data inputs from the tuner (e.g., received signal strength) or command signals (e.g., volume, tone or balance controls). Thus, it is often necessary to digitize a number of different input signals.

Analog-digital conversion can be achieved using stand-alone A/D or D/A integrated circuits (ICs). Each IC has an associated part cost and requires its own signal path into the DSP IC, supporting functions (such as a clock), and separate packaging space. Thus, it is desirable to minimize the number of analog-digital converters to be used.

DSP ICs are also produced with some A/D and D/A converters already included on the integrated circuit. Since the number of such converters is limited, it is necessary to utilize them as efficiently as possible.

It is known to share a single analog-digital converter between two or more signals by time multiplexing the converter. However, such converters and the associated multiplexing components are complicated, have increased costs, and reduce the sampling rate that may be utilized with each of the multiplexed signals.

SUMMARY OF THE INVENTION

It is a principal object of the present invention to provide analog-digital conversion of a plurality of signals using a single converter.

It is a further object of the invention to simultaneously digitize a main information AC signal and a control signal in a single A/D converter for use in a DSP-based audio system.

These and other objects are achieved in the signal processing system of the present invention through frequency multiplexing of the converted signals. Thus, a source of an AC signal substantially without frequency components below a predetermined frequency and a source of a low frequency signal substantially without frequency components above the predetermined frequency are provided. The AC signal and the low frequency signal are combined in a summing means to produce a sum signal. The sum signal is analog-digital converted in a conversion means to produce a converted sum signal. After conversion, the converted sum signal is separated into a converted low frequency signal and a converted AC signal by a frequency separating means

BRIEF DESCRIPTION OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

DETAILED DESCRIPTION OF PREFERRED EMBODIMENTS

Figure 1:
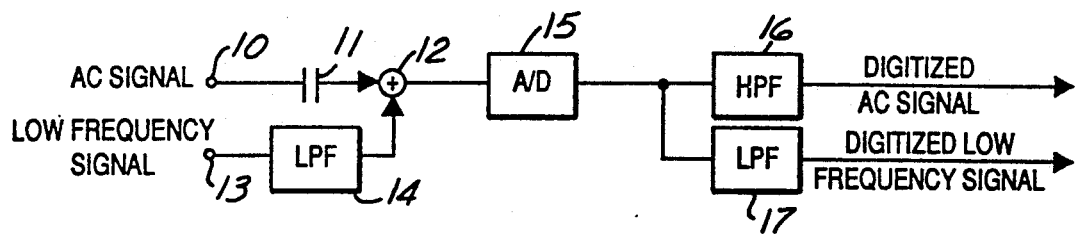
FIG. 1 is schematic diagram of a preferred embodiment of an analog-to-digital converter.

In FIG. 1, an AC signal (e.g., an information signal) at a terminal 10 is coupled through a capacitor 11 to one input of a summer 12. A low frequency signal (e.g., a substantially DC signal such as a control signal) at a terminal 13 is coupled through a lowpass filter 14 to another input of summer 12. Capacitor 11 blocks any content of the AC signal having a frequency below a predetermined frequency. Lowpass filter 14 blocks any content of the low frequency signal which is above the predetermined frequency. Thus, the signals added by summer 12 do not substantially overlap in frequency.

The sum signal is provided to an analog-to-digital (A/D) converter 15 to generate a digital sum signal. The analog AC and low frequency signals are thus converted to digital using a single A/D converter. Since the two signals are distinct in frequency, they may be separated after conversion by one of several methods. As shown in FIG. 1, the converted sum signal is provided to a highpass filter 16 for recovering the digitized AC signal and to a lowpass filter 17 for separating the digitized low frequency signal. Such digital filters may be obtained using conventional filter techniques as is known in the art (e.g., finite implulse response or infinite impulse response filters).

Figure 2:
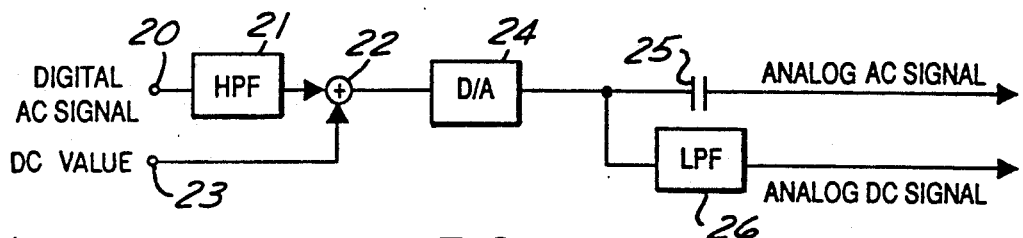
FIG. 2 is a schematic diagram of a preferred embodiment of a digital-to-analog converter.

FIG. 2 shows an embodiment of the invention employing digital-to-analog (D/A) conversion. A digital AC signal is provided at a terminal 20 to a highpass filter 21 and then to one input of a summer 22. A digital DC value is provided at a terminal 23 and to another input of summer 22 (depending on the characteristics of the digital DC value, a lowpass filter may be needed). Highpass filter 21 removes any DC content in the digital AC signal so that the signals added by summer 22 do not overlap in frequency. The digital sum is provided to a D/A converter 24. The resulting analog signal is separated in frequency by a capacitor 25 to produce an analog AC signal and by a lowpass filter 26 to generate an analog DC value.

Figure 3:
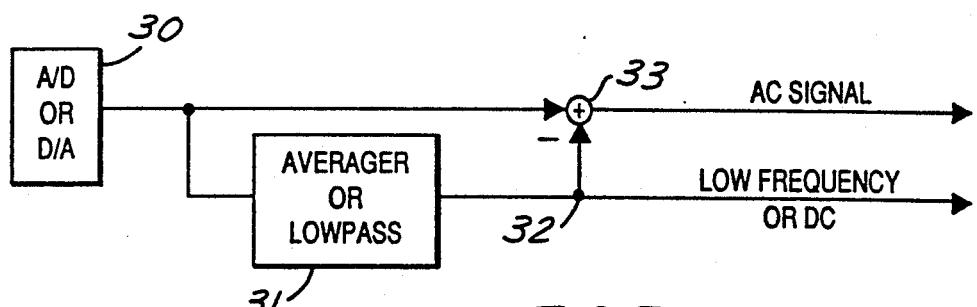
FIG. 3 is a schematic diagram of an alternate embodiment for either an A/D or D/A converter.

FIG. 3 shows an alternate embodiment for separating the simultaneously converted signals after conversion. An analog-digital (i.e., A/D or D/A) converter 30 provides a converted sum signal to a low frequency separater 31 which may be a lowpass filter or an averager. The low frequency or DC signal is provided at an output 32 and is also provided to a subtracting input on a summer 33. The converted sum signal is provided to another input of summer 33 so that the low frequency or DC signal is subtracted from the converted sum signal to generate a converted AC signal. Thus, summer 33 constitutes a DC removal circuit, which may provide a lower processing requirement when the converted signals are digital.

Figure 4:
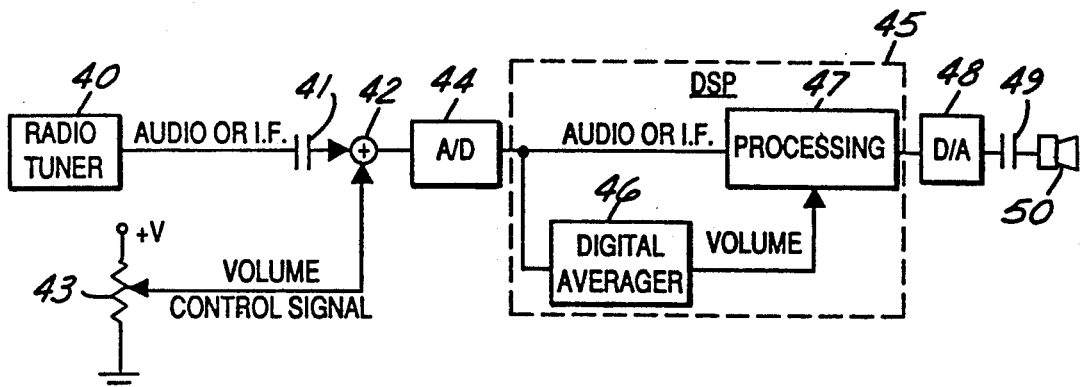
FIG. 4 is a schematic diagram of an audio system employing an analog-to-digital converter according to the present invention.

FIG. 4 shows a digital audio system employing the present invention. A radio tuner 40 receives a radio broadcast signal and generates either a demodulated audio signal or an undemodulated intermediate frequency signal. The audio or IF signal consitutes an AC signal which does not include any information-bearing DC component. The AC signal is coupled through a capacitor 41 to one input of a summer 42. Capacitor 41 removes any spurious DC offset or low frequency component.

A potentiometer 43 generates an operator command signal, such as a volume control signal or a tone control signal, which is provided to another input of summer 42. Even during adjustment of this signal, the frequency of the signal remains sufficiently small so that the frequencies of the summed signals do not overlap (i.e., no lowpass filtering is required). The summed analog signal is provided to an A/D converter 44 which simultaneously digitizes both signals. The converted sum signal is provided to a digital signal processor (DSP) 45, wherein a digital averager 46 separates the DC component from the summed signal to reconstruct the volume control signal. The converted sum signal representing a digitized audio or intermediate frequency signal is provided to a DSP processing block 47 for performing normal radio receiver functions, such as demodulation, stereo decoding, volume adjustment, or tone adjustment. Processing block 47 receives the digital volume control signal for use in a volume control algorithm.

In the system shown in FIG. 4, the converted sum signal is input directly into processing block 47 without highpass filtering or DC removal since in a typical receiver the reproduction of audio is insensitive to any DC offset in the audio or IF signal. However, in other applications a high frequency separation circuit or processing block may be required.

The processed audio signal is provided from DSP 45 to a D/A converter 48. The resulting analog signal is coupled to a speaker 50 through a capacitor 49 which blocks any remaining DC component.

In the system of FIG. 4, a DC control signal can be digitized with almost no reduction of the dynamic range available for the AC (i.e., information-bearing) signal. For example, a typical digital audio system requires about 16 bits of resolution for the A/D converter of the audio or intermediate frequency signal. A typical input voltage range is about one volt peak-to-peak. An input DC command signal may need a typical resolution of about 8 bits or 256 output states of the A/D converter. The voltage range for the control signal is selected to range from zero to 1/256 of the range for the main information signal, or about 3.9 millivolts. By removing 256 states out of the 65,536 possible output states from the A/D converter, the loss of dynamic range for digitizing the main formation signal is only about 0.03 dB.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An audio reproduction system wherein an audio signal and a control signal are input to a digital processing section with an audio signal resolution and a control signal resolution, respectively, said audio signal resolution being greater than said control signal resolution, and said control signal resolution corresponding to a predetermined number of control states, said audio reproduction system comprising:
   an analog audio source for providing said audio signal and having a predetermined peak-to-peak voltage range;
   a control signal source generating said control signal for controlling the digital processing of said audio signal;
   summing means coupled to said analog audio source and said control signal source for generating an analog sum signal;
   an analog-to-digital converter coupled to said summing means and converting said analog sum signal to a digital sum signal, said analog-to-digital converter having a predetermined number of bits of resolution providing a predetermined number of output states;
   digital low-frequency separating means coupled to said analog-to-digital converter for separating a digital control signal from said digital sum signal; and
   digital audio processing means for processing at least a portion of said digital sum signal in a manner responsive to said digital control signal;
   wherein said control signal has a maximum analog voltage substantially equal to said predetermined peak-to-peak voltage range times the ratio of said predetermined number of control states to said predetermined number of output states.

2. The audio reproduction system of claim 1 further comprising low-frequency blocking means coupled between said analog audio source and said summer means for removing any DC offset or low frequency component in said audio signal.

3. The audio reproducing system of claim 2 wherein said low-frequency blocking means is comprised of a coupling capacitor.

4. The audio reproduction system of claim 1 wherein said control signal is comprised of an operator command signal.

5. The audio reproduction system of claim 4 wherein said operator command signal is comprised of a volume command.

6. The audio reproduction system of claim 1 wherein said control signal is comprised of a received signal-strength data signal.

* * * * *